US007152081B2

(12) United States Patent
Gremmert (10) Patent No.: US 7,152,081 B2
(45) Date of Patent: Dec. 19, 2006

(54) METHODS FOR EFFICIENT FILTERING OF DATA (75) Inventor: Scott R. Gremmert, Redmond, WA (US)

(73) Assignee: oHoneywell International Inc., Morristown, NJ (US)

( * ) Notice: Subject to any disclaimer, the term of this patent is extended or adjusted under 35 U.S.C. 154(b) by 501 days.

(21) Appl. No.: 10/085,254

(22) Filed: Feb. 26, 2002

(65) Prior Publication Data
US 2003/0033336 A1 Feb. 13, 2003

Related U.S. Application Data (60) Provisional application No. 60/310,773, filed on Aug. 7, 2001.

(51) Int. Cl.
G06F 17/10 (2006.01)
(52) U.S. Cl. ..................................... 708/300
(58) Field of Classification Search ............... 708/207, 708/200–202, 300–323
See application file for complete search history.

(56) References Cited

U.S. PATENT DOCUMENTS

| | | | | |
|---|---|---|---|---|
| 4,868,773 A | * | 9/1989 | Coyle et al. | 708/304 |
| 4,953,145 A | * | 8/1990 | Carlson | 367/138 |
| 5,138,567 A | * | 8/1992 | Mehrgardt | 708/304 |
| 5,246,670 A | * | 9/1993 | Haber et al. | 422/102 |
| 5,862,064 A | * | 1/1999 | Bae et al. | 708/304 |
| 5,900,006 A | * | 5/1999 | Yoon | 708/202 |
| 5,912,826 A | * | 6/1999 | Bangham et al. | 708/300 |
| 5,968,111 A | * | 10/1999 | Bae et al. | 708/202 |
| 6,018,750 A | * | 1/2000 | Connell et al. | 708/202 |
| 6,199,084 B1 | * | 3/2001 | Wiseman | 708/304 |

FOREIGN PATENT DOCUMENTS

JP 05-216753 4/1995

OTHER PUBLICATIONS

Gonzalo et al., On the synthesis of median filter systems, Apr. 1987, IEEE transactions on circuits and systems, vol. CAS-34, pp. 420-429.*
Lin Yin et al., Weighted median filters: a tutorial, Mar. 1996, IEEE Transactions on circuits and systems-II: analog and digital signal processing, vol. 43, No. 3, pp. 157-192.*
Smoka et al., On the fast modified vector median filter, May 2001, IEEE, pp. 1315-1319.*
Gonzalo Arce, A general weighted median filter structure admitting negative weights, Dec. 1998, IEEE transactions on signal processing, vol. 46, No. 12, pp. 3195-3205.*
Lin et al., Weighted Median Filters: A Tutorial, IEEE Transactions on Circuits and Systems-II: Analog and digital signal processing, vol. 43, No. 3, Mar. 1996, pp. 157-192.*
Gonzalo et al., On the Synthesis of Median Filter Systems, IEEE Transactions on Circuits and Systems, vol. 34, No. 4, Apr. 1987, pp. 420-429.*

(Continued)

Primary Examiner—Kakali Chaki
Assistant Examiner—Chat C. Do
(74) Attorney, Agent, or Firm—Black Lowe & Graham PLLC (57) ABSTRACT An apparatus and method for filtering data that include retrieving a plurality of data samples from memory; computing a locus of the samples; computing a distance between an input value and the locus; comparing the distance between the input value and the locus with a first threshold value; applying a distance-based filter to the samples; and comparing an output value of the median filter with a second threshold value.

16 Claims, 8 Drawing Sheets

OTHER PUBLICATIONS

Ruikang et al., Optimal Weighted Median Filtering Under Structural Constraints, IEEE Transactions on Signal Processing, vol. 43, No. 3, Mar. 1995, pp. 591-604.*

Patrick et al., Median Filtering by Threshold Decomposition, IEEE Transactions on Acoustics, Speech, and signal processing vol. Assp-32, No. 6, Dec. 1984, pp. 1183-1188.*

* cited by examiner

```
//***********************************************************
// CLASS CircMedian3Filter (derived from Median3Filter)
//***********************************************************

// rInp = value to be filtered, returned Real is filtered value
Real CircMedian3Filter::Filter(Real rInp)
{
Real rAvg = (arF[0] + arF[1]) / 2;

if ((rInp - rAvg) > rHALFCIRCLE)
        rInp -= rFULLCIRCLE;
    else if ((rInp - rAvg) < - rHALFCIRCLE)
        rInp += rFULLCIRCLE;

Real r = Median3Filter::Filter(rInp);

// normalize out any circular adjustments
    if (r > rFULLCIRCLE)
    {
        arF[0] -= rFULLCIRCLE;
        arF[1] -= rFULLCIRCLE;
        r -= rFULLCIRCLE;
    }
    else if (r < -rHALFCIRCLE)
    {
        arF[0] += rFULLCIRCLE;
        arF[1] += rFULLCIRCLE;
        r += rFULLCIRCLE;
    } return (r); // return median value
} // CircMedian3Filter::Filter
```

```
//***************************************************************
// CLASS Median3Filter
//***************************************************************
Median3Filter : : Median3Filter(void)
{
SetTo(0);
} // Median3Filter : : Median3Filter
//***************************************************************
// rInp = value to be filtered, returned Real is filtered
value
Real median3Filter : : Filter(Real rInp)
{
int iCase = 0;
    if (arF[0] > arF[1])
    iCase | = 1;
    if (arF[1] > rInp)
    iCase | = 2;
    if (rInp > arF[0])
    iCase | = 4;
Real r = 0;
    switch (iCase)
    {
        case 2: // 010: 0 <= 1, 1 > 2, 2 <= 0 (1 > 0 > 2)
        case 5: // 101: 0 > 1, 1 <= 2, 2 > 0 (2 > 0 > 1)
            r = arF[0];
            break;
        case 0: // 000: 0 <= 1, 1 <= 2, 2 <= 0 (0 = 1 = 2)
        case 3: // 011: 0 > 1, 1 > 2, 2 <= 0 (0 > 1 > 2)
        case 4: // 100: 0 <= 1, 1 <= 2, 2 > 0 (2 > 1 > 0)
            r = arF[1];
            break;
        case 1: // 001: 0 > 1, 1 <= 2, 2 <= 0 (0 > 2 > 1)
        case 6: // 110: 0 <= 1, 1 > 2, 2 > 0 (1 > 2 > 0)
            r = rInp;
            break;
//      case 7: // 111: 0 > 1, 1 > 2, 2 > 0 (illogical)
//      default: // MORE THAN 3 BITS SET (N/A)
    }
    arF[idx] = rInp;
    idx ^= 1;
    return (r); // return median value
} // Median3Filter : : Filter
//***************************************************************
// rInp = value filter is preset to
void Median3Filter : : SetTo(Real rInp)
{
    arF[0] = arF[1] = rInp;
    idx = 0;
} // Median3Filter : : SetTo
```

METHODS FOR EFFICIENT FILTERING OF DATA

This application claims the benefit of U.S. Provisional Application Ser. No. 60/310,773, filed in the name of Scott R. Gremmert on Aug. 7, 2001, the complete disclosure of which is incorporated herein by reference.

FIELD OF THE INVENTION

The present invention is directed to data filters and, more particularly, to circular distance normalization for filtered data and the efficient median filtering of small data sets.

BACKGROUND OF THE INVENTION

Difference-based filters compute the difference between an incoming sample and sample(s) stored in the filter to determine a new output value. Such filters are designed to operate on linear data. However, difference-based filters, including median and low-pass filters, do not operate correctly on 'circular' data, such as longitude, heading, or track angle, until the data has been linearized or normalized. For example, a typical filter will see heading angles of +179 degrees and −179 degrees, which are only two degrees apart, as being 358 degrees apart, and an incorrect filter output is generated. A typical solution in the art is to first to re-scale the input signal into a fixed-point binary number using the natural word width of the hardware, which must be known beforehand. Next the re-scaled number is filtered using fixed-point arithmetic, fixed-point scale factors, and overflow compensation. Finally the number is optionally re-scaled back to engineering units. For systems that use floating point hardware, this solution requires two extra multiply operations, overflow tests, and custom development of fixed-point filter algorithms for the specific set of signals. The typical algorithms may also truncate the range or resolution of the signal in some cases.

One known difference-based filter is a median filter. Simply stated, a median filter picks the middle value from among an odd number of candidates. When the data lie on a line, the picking process is a simple concept.

As described more generally in U.S. Pat. No. 5,900,006, which is incorporated by reference herein in its entirety, a median filter is a non-linear filter which outputs data of a medium magnitude as a median value among a predetermined number of data.

Figure 1:
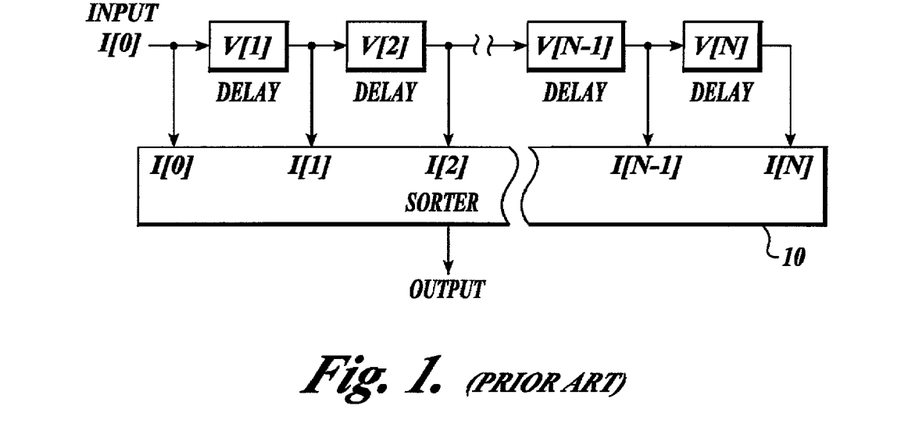
FIG. 1 is a block diagram of a conventional median filter.

FIG. 1 shows a block diagram of a conventional median filter. A series of input data is continuously supplied to an input port and each input datum passes through a cascade of N delay elements V[1] to V[N], one input datum to one element at a time, each input datum being delayed at each delay element, N being an odd positive integer greater than 1. When a new input datum I[0] is applied to the input port, each of N preceding input data I[1], to I[N−1] will be available as an output from each corresponding delay element at a time. A set of these input data I[0] to I[N−1] from the input port and the N delay elements V[1] to V[N] is supplied to a sorter 10 simultaneously, wherein the N input datum provided to the sorter 10 at a time represents the window size of a predetermined magnitude. The sorter 10 is necessary to rearrange the set of these input data I[0] to I[N−1] according to the order of their magnitude. Subsequently, a median value is selected and provided to an output port, wherein the median value represents an input data value corresponding to the median data in the newly arranged set.

When another new input datum I[A] is applied to the input port, each input datum held at each corresponding delay element is transferred to each corresponding next delay element in the series of the delay elements, i.e., I[N−1] held at V[N−1] being transferred to V[N], replacing I[N] previously held at V[N] and so on, thereby forming a new set of input data I[A], I[0], . . . I[N−2] including the new input data I[A]. The new set of input data is fed to the sorter 10 and then rearranged once again according to the order of their magnitude, independent of the order of the data sorted in a former sorting procedure, to repeat the process of selecting a median value for the new set of input data. The time to sort for a median value generally increases as the size of the window increases. Adding lag, or phase delay, to the output signal of the conventional median filtering procedure as described above is problematic for real-time control systems because of the reduced system efficiencies that result.

Consequently, only with difficulty does a conventional median filter accommodate a large or variable size of window in response to a high level of variable impulse noises in the input data being filtered.

Figure 2:
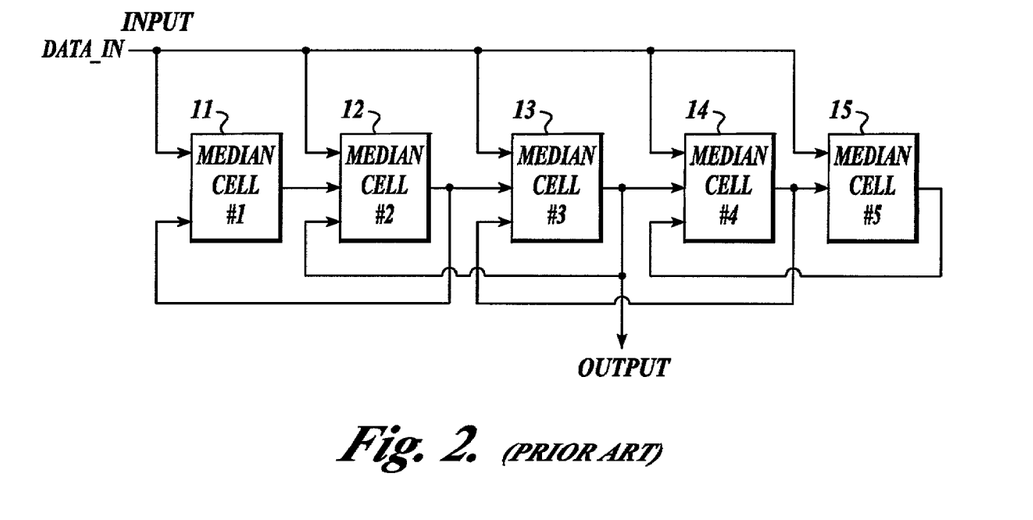
FIG. 2 illustrates one embodiment of an existing five-degree median filter.

FIG. 2 illustrates an existing fifth order median filter as described by U.S. Pat. No. 5,968,111, which is incorporated by reference herein in its entirety. In FIG. 2, median cells 11–15 store five recently input data values. The five data values stored in the median cells 11–15 are sorted in a descending order from the data value stored in the leftmost median cell 11. The datum value DATA_IN input to the median filter of FIG. 2 is individually compared with the stored data values in the median cells 11–15. Then, according to the comparison result, the input datum is stored in one of the median cells 11–15 in a manner that a descending order is maintained. At the same time, the datum which was firstly input to the median filter of FIG. 2 is deleted. In this manner, the data stored in the respective median cells 11–15 always maintain a descending order. As a result, the median filter can output a middle value stored in the median cell 13 which is positioned in the middle of the median cells 11–15, as a median value OUT.

Figure 3:
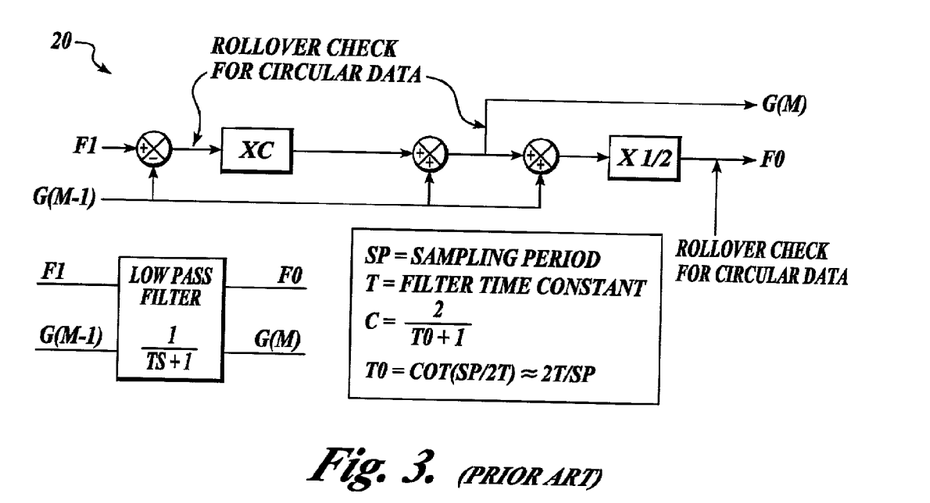
FIG. 3 illustrates one embodiment of an existing distance-based filter employing low-pass filters.

FIG. 3 illustrates one embodiment of another known difference-based filter, the first-order low-pass filter 20. Derivatives of the low-pass filter are the high-pass and band-pass filters. Many different algorithms are known for implementing low-pass filters, all having a general characteristic of determining the difference between the input and output signals, and applying a portion of the difference to the output signal through a variety of feedback and scaling mechanisms.

In FIG. 3, the previous filter stored value G(M−1) is subtracted from the filter input FI. The difference is multiplied by a gain factor C and added to the previous filter stored value to create a new filter stored value G(M). In the example implementation, the previous and the new filter output values are averaged to create the filter output value FO. The first-order low-pass filter in FIG. 3 includes a roll-over check for circular data on the difference signal resulting from subtracting previous filter stored value G(M−1) from the filter input FI and on the newly created filter stored value G(M). A roll-over check for circular data is also performed on the filter output value FO.

The high-pass is generated by simply subtracting low-pass filter output from filter input according to: FO=FI−LPF(FI).

The bandpass filter is generated in similar known fashion.

The problem of applying circular data to a difference-based filter, such as the low-pass filter or its derivatives, is evident when the input signal value crosses over the break-point, for example, when the input signal value rolls from 359 degrees to zero degrees, or $+\pi$ radians to $-\pi$ radians. Without normalization a large difference signal (approximately 360 degrees or $2\pi$ radians) is input to the filter, which causes a large step in the output when a very small step in the opposite direction is what is desired.

Figure 4:
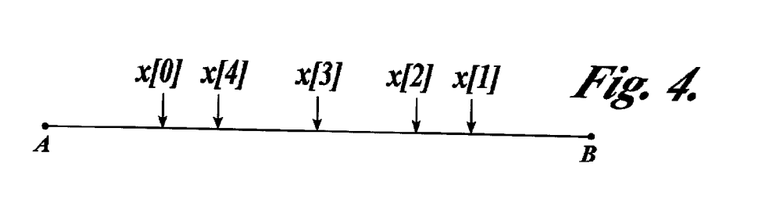
FIG. 4 is a definition domain of data expressed as magnitudes on a line segment.

FIG. 4 shows the definition of a domain of data expressed as a line segment AB. Five data values are shown as x[0], x[1], x[2], x[3], x[4]. The numerical value of a point is the signed distance (difference in coordinates) between that point and endpoint A. The median filter of FIG. 2 is appropriate to use on these data because the domain is linear and the filter only handles data for which the linear sort order is clearly defined.

When the data lie on a circle, however, picking the median value becomes conceptually more difficult. The common sense approach is to first assume that the "distance" between two co-circular points is the lesser of the two angles separating them, never more than 180 degrees; linearize the data by choosing the angular range that includes all the samples corresponding to the largest distance that can be computed from the samples; and pick the middle sample in this angular range. For the special case of multiple co-circular data samples separated by equal angles, special rules must be applied. Such special cases include the exemplary cases of three samples separated by 120 degree and five separated by 72 degree, et cetera.

Figure 5:
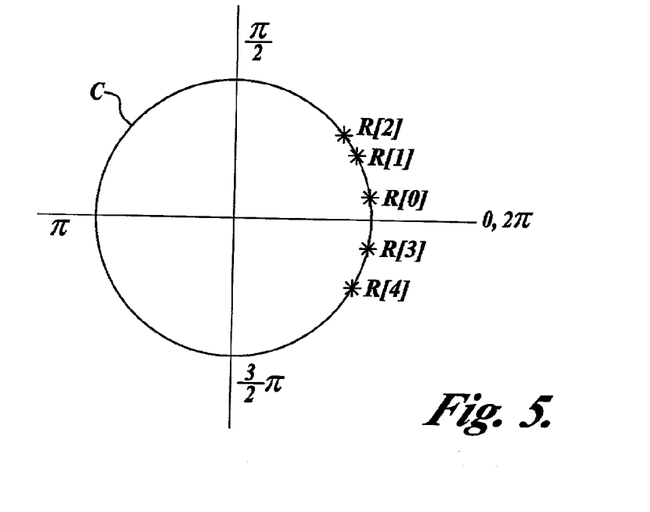
FIG. 5 illustrates a definition domain of co-circular data expressed as angles on a circle C.

FIG. 5 illustrates a definition of a domain of data expressed as angles on a circle C, in which angles "0" and "$2\pi$" correspond to the same point on the circle C. The above incorporated U.S. Pat. No. 5,968,111 describes one example of a conventional median filter applied to determine the median value among the data points according to the definition domain illustrated in FIG. 5, wherein the multiple co-circular data points on the circle C correspond to angles having a circularly corresponding relationship as angle increases. In the case when the following data points are input:

R[0]=theta[1], R[1]=theta[2], R[2]=theta[3], R[3]
=2$\pi$theta[2], where:

0<theta[1]<theta[2]<theta[3]<$\pi$/2, because the existing median filter compares only magnitudes of data, R[2] is output as a median value, which is not a desired median value. The desired median value is R[0], as shown in FIG. 5. Thus, the existing median filter does not provide an appropriate median value with respect to data expressed as angles without pre-normalization.

U.S. Pat. No. 5,968,111 describes one method for implementing a circular median filter for determining the median value among multiple co-circular data points. According to the method described by U.S. Pat. No. 5,968,111, range normalization starts with distance computation between neighboring pairs of cells, and distance is always positive. The input cells are first sorted by magnitude. The method of U.S. Pat. No. 5,968,111 requires N additional storage locations, N−1 distance calculations, and on the order of N^2 comparison operations. Thus, the circular median filter algorithm as exemplified by U.S. Pat. No. 5,968,111 is computation intensive and memory intensive, especially for larger data sets.

SUMMARY OF THE INVENTION

The present invention provides an efficient means of circular median filtering that reduces computational load and increases speed. The apparatus and method of the present invention provide means for filtering data that include retrieving a plurality of data samples from memory; computing a locus of the samples; normalizing the input value to a range centered on the locus; passing the data through a distance-based filter; and normalizing the output value to a pre-defined output range.

According to different aspects of the invention, the distance-based filter provided by the apparatus and method of the present invention is any distance-based filter, including a median filter, a low-pass filter, or derivatives the low-pass filter, such as high-pass or band-pass filters.

According to another aspect of the invention, the filtering means provided by the apparatus and method of the present invention further includes normalizing the output value of the distance-based filter when the output value exceeds the second threshold value.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus, a method, and a computer program product for circular distance normalization of filtered data that includes the efficient median filter of the present invention or another suitable median filter. The circular distance filter of the present invention operates the adaptive method of the invention for data filtering that eliminates the need for fixed-point scaling and overflow detection, and allows the use of filters coded using floating point mathematics and scale factors. The circular distance normalization method of the invention for filtered data is more efficient for modern computer hardware, more robust, and more precise than prior methods. The method of the present invention is effective with all types of distance-based filters. However, the method is exemplified herein with a median filter. The median filter is of the present invention is an efficient median filter for small data sets.

The adaptive method of the present invention for circular distance normalization of filtered data is a sliding normalization method of filtering that minimizes both memory and computation requirements. The sliding normalization method of the present invention adds no additional storage beyond the median filter data contents, and adds only two to four additional comparison operations. A single distance computation is applied to each input sample.

Figure 6:
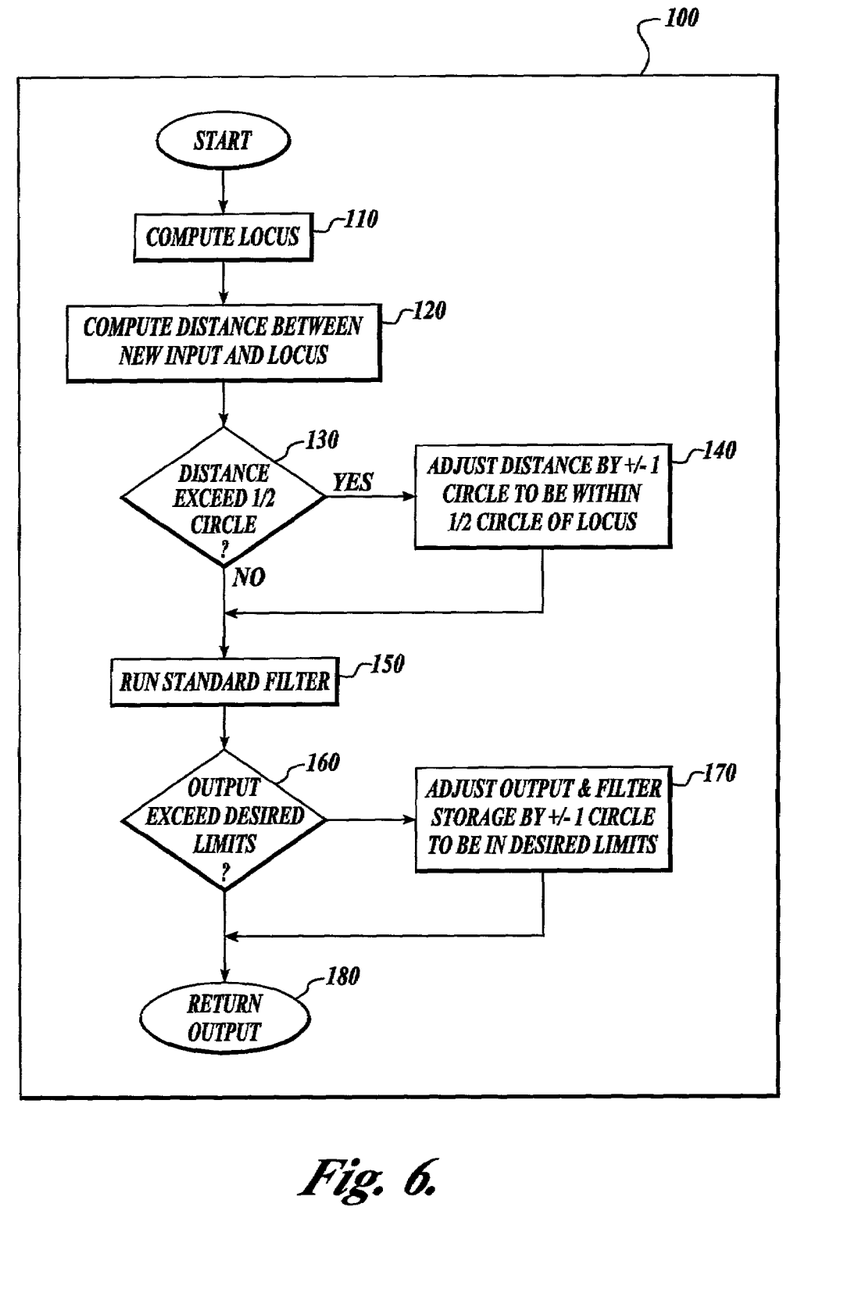
FIG. 6 illustrates an exemplary flow chart of the invention embodied as a median filter for multiple co-circular data points.

FIG. 6 illustrates the median filter of the invention for multiple co-circular data points embodied in an exemplary flow chart 100. According to the method of the present invention, all data are normalized when input, before being stored. The present invention bypasses the need for multiple distance computations by computing in Block 110 a locus of the samples. Multiple computation algorithms are possible, depending on the desired balance between speed and accuracy. For example, the locus can be defined as the average of the two most recent samples. This is very fast, but subject to disturbance from a single bad sample. The locus also can be defined as the average of the two most recent samples together with the input sample. Alternatively, the locus is computed as the average of the three most recent samples, or as the average of the three stored samples. As the number of old samples increases, the responsiveness of the filter to high rates of change is reduced. In another alternative, the arithmetic mean, i.e., the average, of the data is replaced with one of the geometric mean, or the harmonic mean, or the quadratic mean. The locus is alternatively chosen as the most recent output value. The algorithm is substantially insensitive to approximations at this level because the purpose of finding the locus is to select a center point around which the data are to be linearized. The continuously sliding window of linearization provided by the present invention avoids the problems in the prior art arising from fixed breakpoints The distance between the current input value and the locus is computed in Block 120 and compared in Block 130 with a maximum permissible value. For example, if the distance between the input value and the locus exceeds ±180 degrees, the sample is normalized in Block 140 by adding or subtracting 360 degrees to bring the sample within ±180 degrees of the locus. In Block 150 a standard or conventional median or other distance-based filter is applied to the resulting samples. Since all data are normalized before being filtered, the value produced by the computation is a meaningful number. Alternatively, the median filter of the invention as described herein is applied to the resulting samples, practically only for applications with small values of N. The output value of the filter is compared in Block 160 with the desired limits of normalization, which are typically ±180 degree, or 0 and 360 degrees. If the filter output value exceeds the desired limits of normalization, then the output and the internal filter storage locations are appropriately adjusted in Block 170 by ±360 degrees to remain within the desired output range. The limiter provided by the adjustment in Block 170 is utilized by the sliding window of linearization to prevent numeric overflow in the case where the input behavior is progressive rather than oscillatory. If the input data continue around the circle in the same direction over and over, the numeric output value can become very large. The limiter in Block 170 prevents this overflow behavior.

The output returned in Block 180 is constrained to a range compatible with down-stream processing functions.

One embodiment of the present invention includes two approximations or adjustments that trade mathematical precision for real-world run-time efficiency. The approximate computation of the locus of the samples in Block 110 as implemented in FIG. 7 may yield implementation-dependent results for unusual input sequences. Also, the output range is controlled by filter implementation rather than by the input source, which may produce unexpected results if the filter in Block 150 is part of an algorithm library and is not well documented. The behavior can be used to advantage, however, by downstream processing. For example, if one signal is heading (0 . . . 360 degrees) and another signal is track (±180 degrees), then a processing application downstream from the circular distance filter of the present invention typically has first to normalize the heading and track to the same domain of values before a compare or subtract can be performed, for example, to compute yaw or wind or other information. The circular distance filter of the invention normalizes its data to a chosen range, which eliminates an additional downstream set of compare/add operations for each input.

Figure 7:
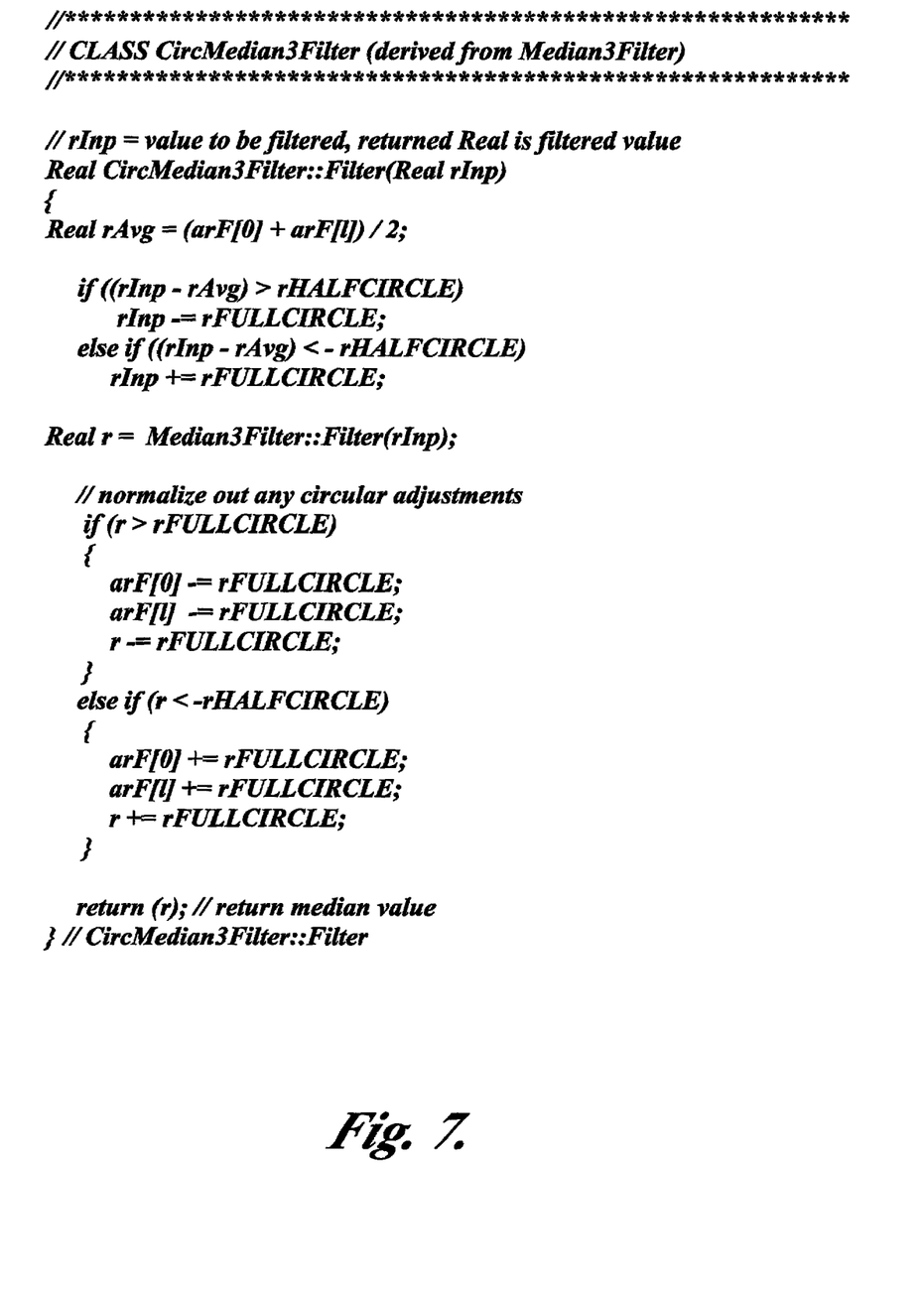
FIG. 7 is one example of coding that embodies the method of the invention as described in FIG. 6.

FIG. 7 is one example of coding that embodies the method of the invention as described in FIG. 6.

Figure 8:
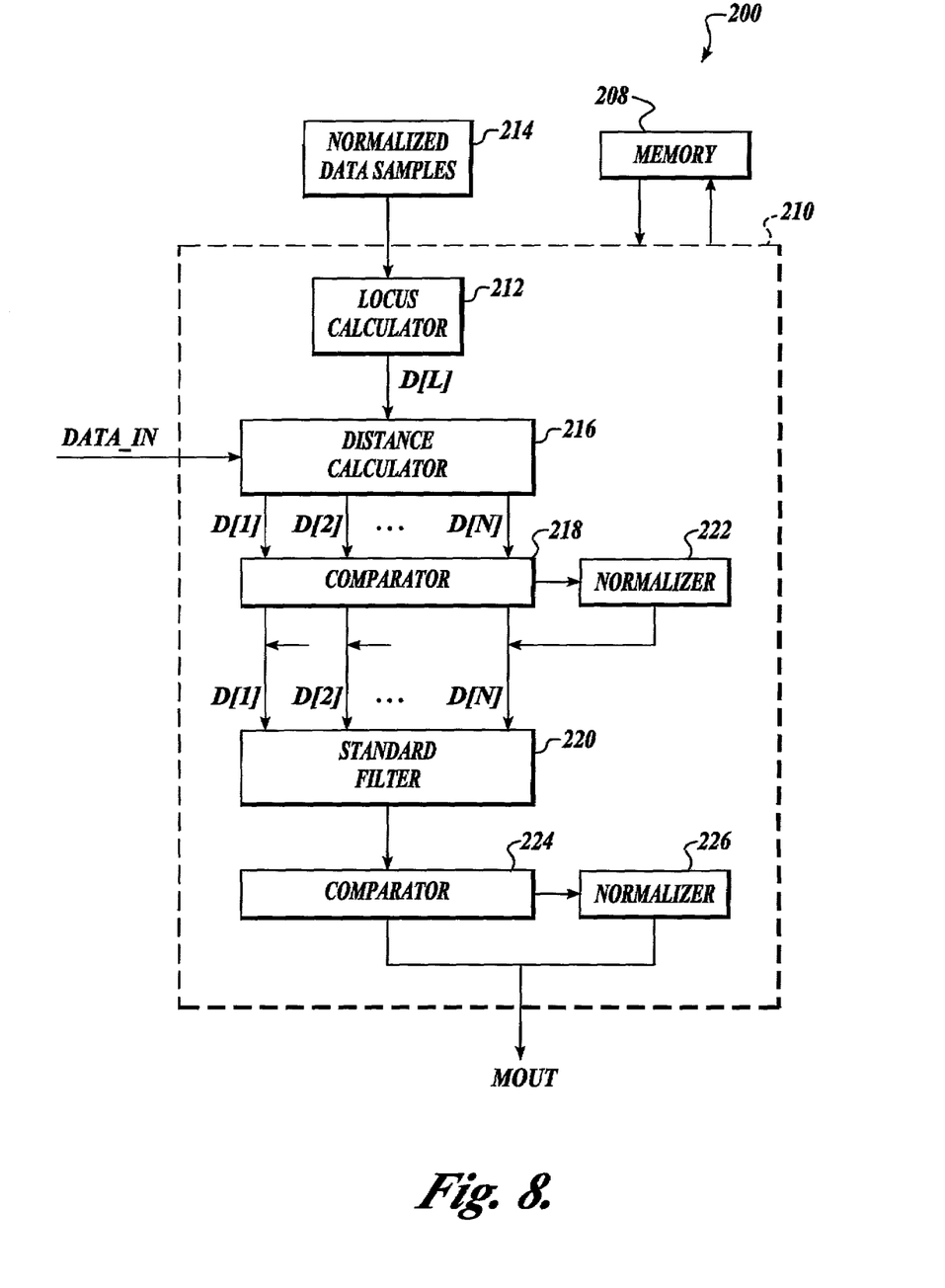
FIG. 8 is one example of the invention embodied as a circular median filter.

FIG. 8 is one example of the invention embodied as a circular median filter 200 having a plurality of machine instructions stored in a memory 208, which are retrieved and operated by a processor 210. Normalized data are input to the processor 210 and a data calculator 212 computes the locus of the normalized data samples as the average of the old data retrieved from memory 214. The data calculator 212 computes the locus as an approximation having a greater or lesser degree of mathematical precision depending upon the desired response. The average "L" produced by the computation is output to a distance calculator 216 that also receives the input data. The distance calculator 216 computes the distances D[1], D[2], through D[N] between each of the input values and the locus. The computed distances D[1]–D[N] are output to a first comparator 218, which compares the computed distances D[1]–D[N] with a maximum permissible value. If the distance between the input value and the locus is less than ±180 degrees, the computed distances D[1]–D[N] are output to a conventional median or other distance-based filter 220, as described herein. However, if one or more of the computed distances D[1]–D[N] between the input value and the locus exceeds ±180 degrees, the sample is passed to a first normalizer 222, which normalizes the sample by adding or subtracting 360 degrees so that the sample is within ±180 degrees of the locus. The distance-based filter 220 is applied to the resulting samples, computed distances D[1]–D[N], as described above, and outputs a median value "M." The output value M of the distance-based filter 220 is passed to a second comparator 224 and compared with predetermined limits of normalization. If the output value of the distance-based filter 220 are within the predetermined limits of normalization, the output value M is provided. However, if the output value of the distance-based filter 220 exceeds the predetermined limits of normalization, the output value and the internal filter storage locations are passed to a second normalizer 226, which appropriately normalizes the data before outputting the median value M. The output of the distance-based filter 220 is thus the circular median value, which can be used by downstream processing.

The circular filter of the invention can be used to filter the circular data output of a digital compass or another device having circular data output, such as longitude, heading, track angle, or the current state angle of various rotating machinery such as wheel position for anti-lock brakes.

In addition to providing apparatus and methods, the present invention also provides a computer program product for filtering data. The computer program product includes a computer readable storage medium having computer readable program code means embodied in the medium. With reference to FIG. 8, the computer readable storage medium may be part of the memory device 208, and the processor 210 of the present invention implements the computer readable program code means to efficiently filter circular data.

The computer-readable program code means includes first computer-readable program code means for determining a locus of a received plurality of data samples. Further, the computer-readable program code means also includes second computer-readable program code means for normalizing an input value to a range centered on the locus determined from the first computer-readable program code means. Third computer-readable program code means are included for filtering the data through a distance-based filter, and fourth computer-readable program code means are included for normalizing an output value of the distance-based filter to a predetermined output range.

With reference to the first computer-readable program code means, as discussed previously with respect to the various apparatus and methods of the present invention, the first computer-readable program code means may determine the locus of the samples by computing an average of the samples. For example, the first computer-readable program code means may determine the locus of the samples by computing an average of the last two samples or as otherwise discussed herein. The average of the samples may be computed by computing one of an arithmetic mean, a geometric mean, a harmonic mean, and a quadratic mean of the samples.

An Efficient Median Filter For Small Data Sets

Figure 9:
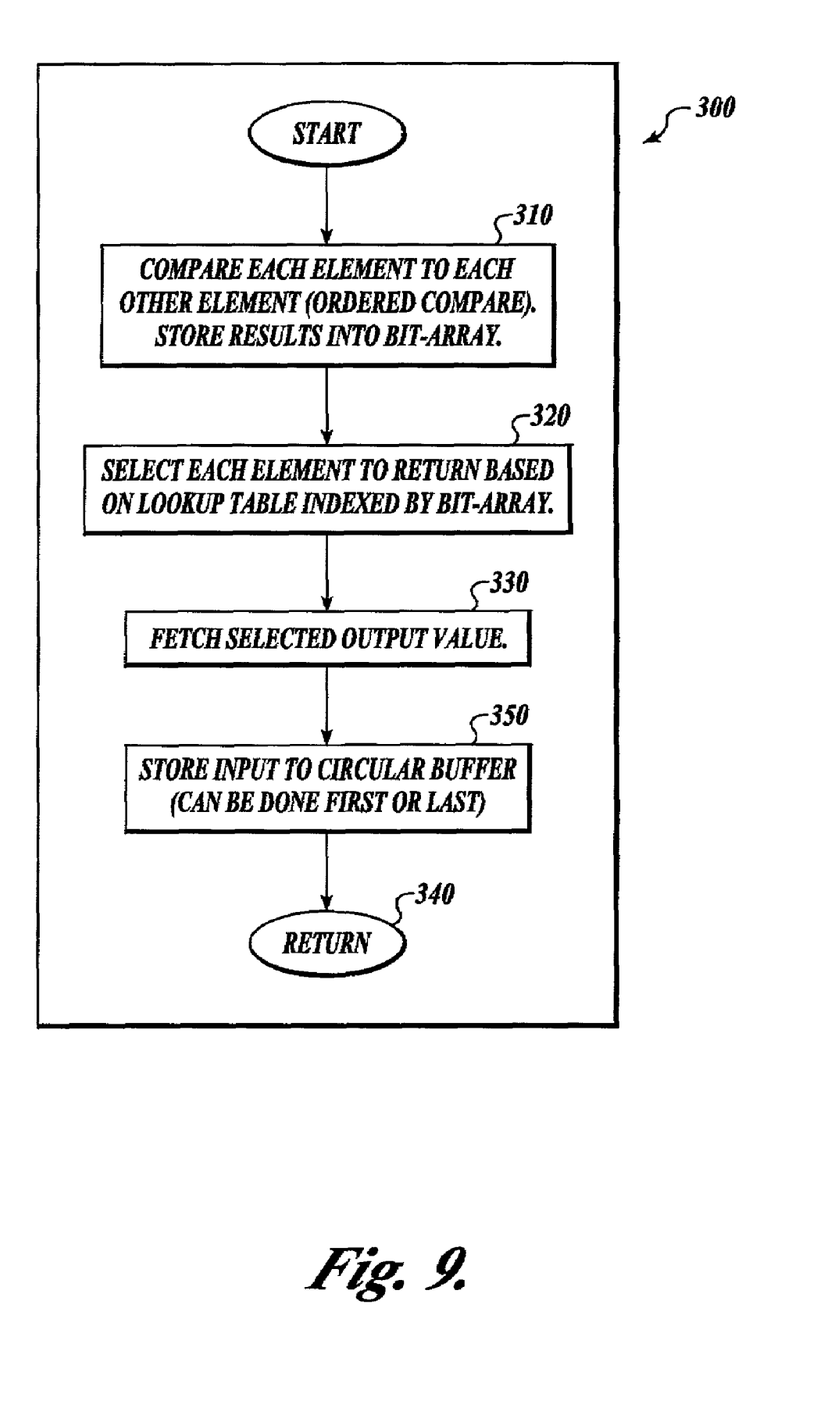
FIG. 9 illustrates an exemplary flow chart of the invention embodied as an efficient median filter for small sets of data points.

FIG. 9 illustrates the median filter of the invention that is efficient for small values of N embodied in an exemplary flow chart 300. According to the method of the present invention, a bit-parallel processing method for small data sets is provided that minimizes both storage requirements and execution time. For example, the embodiment of FIG. 9 is useful for data sets in the range of about N=3 to 5, whereby the sorting step of the prior art is eliminated, and fetch, comparison, and store operations are reduced to a minimum. The method of the present invention also minimizes supplemental storage space. The method further makes use of a form of parallel processing for the comparison step that is suited to software running on general-purpose computer processors. This method is also well suited to hardware or firmware implementation.

The filtering method of the present invention uses on the order of N memory accesses and order N comparison operations, rather than the order 2N storage locations or the order $N^2$ compare operations of the prior art. Thus, for the N=3 example, the number of memory accesses and comparison operations is fixed at 3. For the N=4 example, the number of memory accesses and comparison operations is on the order of 2N, and for the N=5 example, the number of memory accesses and comparison operations is on the order of 3N. The number of operations is constant per iteration so that the computational method is time-deterministic, which is advantageous for computational resource management. Also, the median filtering method of the invention uses less memory storage than conventional methods, which must trade speed for memory space.

The filtering method of the current invention utilizes a form of parallel processing not unlike an address decoder or lookup table that implements the various sorting operations simultaneously. A conventional circular buffer for incoming sample data is employed. As shown in Block 310, each buffered element is compared to each other element one time, using an ordered compare operation. The results of these comparisons are aggregated and stored into a bit-array, which is used as an index into a lookup table in Block 320. In Block 330, the lookup table returns the index of the circular buffer element to return in Block 340. If the incoming sample data has not been stored, in Block 350 the input is stored using a conventional circular buffer.

As applied to a three-element filter, the filtering method of the invention requires only 3 compares and one 8-element table. A five-element filter requires 10 compares and a 1024 element table. Seven elements requires 21 compares and a 2,097,152 element table. The method is thus optimally applied to applications with small values of N.

Figure 10:
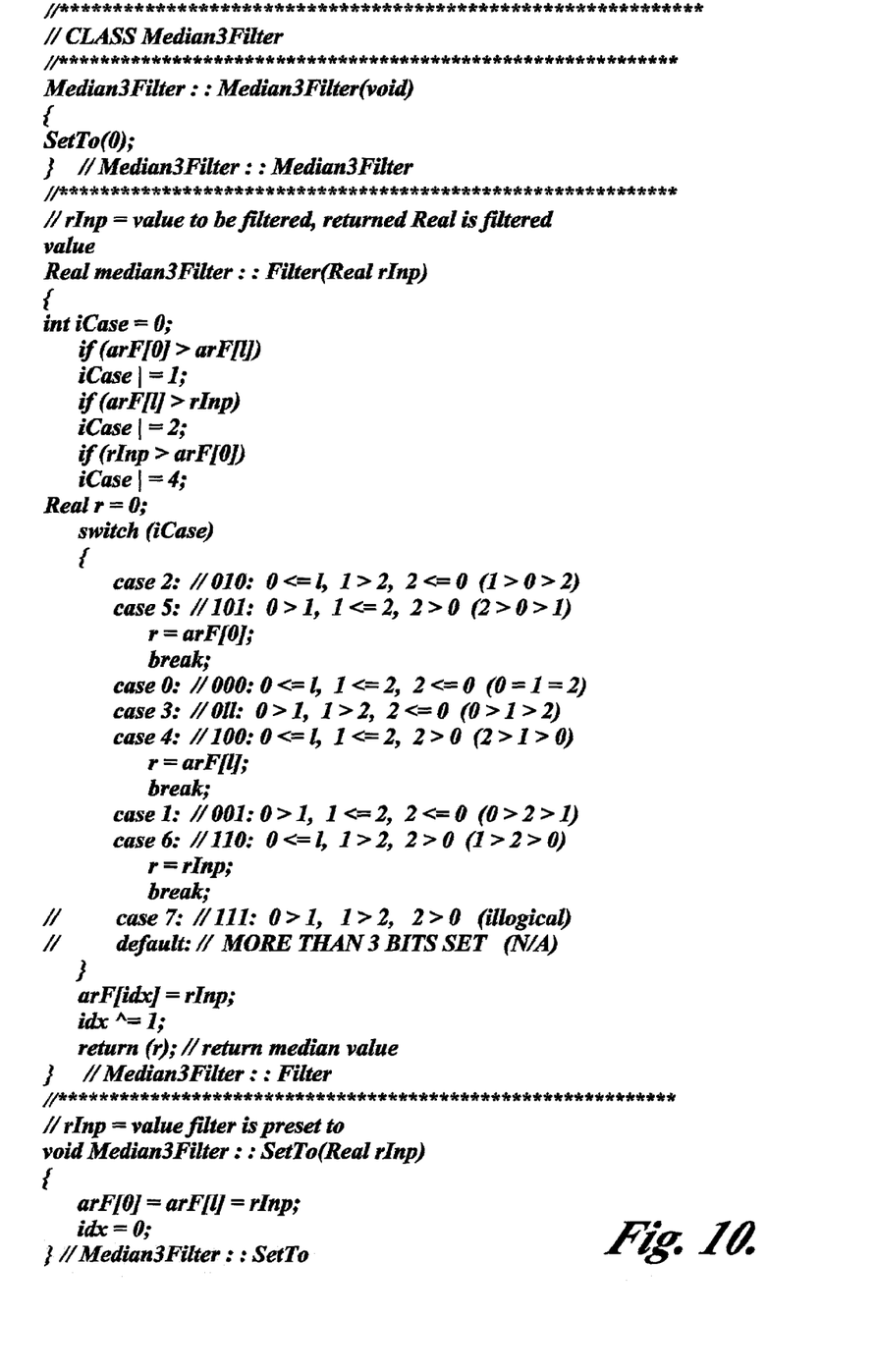
FIG. 10 is one example of coding that embodies the method of the invention described in FIG. 9.

FIG. 10 is one example of coding that embodies the alternative method of the invention as described in FIG. 9.

Figure 11:
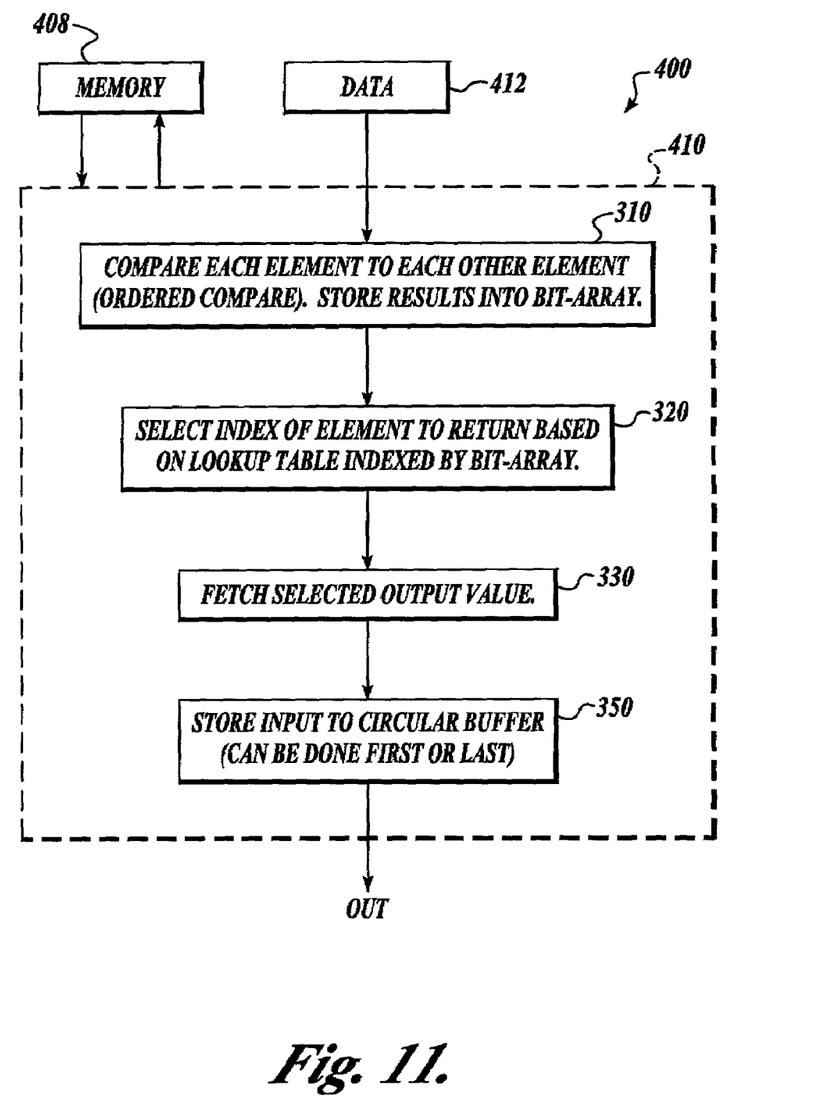
FIG. 11 is one example of the invention embodied as a median filter for small data sets.

FIG. 11 is one example of the invention embodied as a median filter 400 having a plurality of machine instructions stored in a memory 408, which are retrieved and operated by a processor 410. Data are input to the processor 410 and operated upon according to the method embodied in FIG. 9, wherein a conventional circular buffer 412 is used for incoming sample data. The processor 410 executes the retrieved machine instructions to buffer the incoming sample data; compares each buffered data sample to each other data sample one time using an ordered compare operation; aggregates the results of the compare operations; stores the results of the compare operations into a bit-array; indexes into a lookup table as a function of the bit-array; and returns from the lookup table an index of the buffer element. The buffer is structured as a conventional circular buffer, and the incoming sample data is stored using a circular buffer. Alternatively, the incoming sample data is stored using a shift register.

In addition to providing apparatus and methods, the present invention also provides a computer program product for filtering small data sets. The computer program product includes a computer readable storage medium having computer readable program code means embodied in the medium. With reference to FIG. 11, the computer readable storage medium may be part of the memory device 408, and the processor 410 of the present invention implements the computer readable program code means to efficiently filter small data sets.

The computer-readable program code means includes first computer-readable program code means for buffering incoming sample data. Further, the computer-readable program code means also includes second computer-readable program code means for operating an ordered compare function to compare one time each buffered data sample to each other data sample. Third computer-readable program code means are included for aggregating results of the compare operations. Fourth computer-readable program code means are included for storing the results of the compare operations into a bit-array. Fifth computer-readable program code means are included for indexing into a lookup table as a function of the bit-array, and sixth computer-readable program code means are included for returning an index of the buffer from the lookup table.

With reference to the first computer-readable program code means, as discussed previously with respect to the various apparatus and methods of the present invention, the first computer-readable program code means may utilize a buffer that is structured as a conventional circular buffer.

While the preferred embodiment of the invention has been illustrated and described, it will be appreciated that various changes can be made therein without departing from the spirit and scope of the invention.

What is claimed is:

1. A method for filtering data, the method comprising:
   receiving a plurality of data samples;
   computing a locus of the samples;
   initially normalizing a value of an input sample to a range centered on the locus;
   after normalizing the value of the input sample, passing the data through a distance-based filter; and
   normalizing an output value of the distance-based filter to a predetermined output range,
   wherein initially normalizing a value of an input sample to a range centered on the locus further comprises selectively adapting the normalizing range as a function a range of the data samples.

2. The method of claim 1 wherein the distance-based filter further comprises a median filter.

3. The method of claim 1 wherein the distance-based filter further comprises a low-pass filter.

4. The method of claim 1 wherein the distance-based filter further comprises one of a band-pass filter and a high-pass filter.

5. The method of claim 1 wherein computing a locus of the samples comprises computing an average of at least two of the samples.

6. The method of claim 1 wherein computing a locus of the samples comprises computing one of an arithmetic mean, a geometric mean, a harmonic mean, and a quadratic mean of the samples.

7. The method of claim 1 wherein computing a locus of the samples comprises computing an average of at least two of the samples together with the input sample.

8. The method of claim 1 wherein computing a locus of the samples comprises computing an average of at least three of the samples.

9. A method for filtering data, the method comprising:
   receiving a plurality of data samples;
   computing a locus of the samples by computing an average of a last three of the samples together with the input sample;
   normalizing a value of an input sample to a range centered on the locus;
   passing the data through a distance-based filter; and
   normalizing an output value of the distance-based filter to a predetermined output range.

10. The method of claim 9 wherein computing a locus of the samples comprises selecting a previous filter output value.

11. A computer program product for filtering data, wherein the computer program product comprises:
    a computer-readable storage medium; and
    computer-readable program code means embodied in the medium, the computer-readable program code means comprising:
        first computer-readable program code means for determining a locus of a received plurality of data samples by determining an average of at least a last three of the data samples together with the input sample,
        second computer-readable program code means for normalizing a value of an input sample to a range centered on the locus determined from the first computer-readable program code means,
        third computer-readable program code means for distance-based filtering of the data, and
        fourth computer-readable program code means for normalizing an output value of the distance-based filter.

12. The computer program product of claim 11 wherein the first computer-readable program code means determines the locus of the samples by selecting a previous filter output value.

13. The computer program product of claim 11 wherein distance-based filtering of the third computer-readable program code means further comprises a median filtering.

14. The computer program product of claim 11 wherein the first computer-readable program code means for determining a locus of a received plurality of data samples further comprises computer-readable program code means for determining a locus of a received plurality of normalized data samples.

15. A method for filtering data, the method comprising:
    receiving a plurality of data samples;
    computing a locus of the samples;
    normalizing a value of an output sample to a range centered on the locus;
    passing the data through a distance-based filter;
    normalizing an output value of the distance-based filter to a predetermined output range; and
    limiting the normalized output value of the distance-based filter within selected limits of normalization, including adjusting the filter output value and the internal filter storage locations to remain within the selected limits of normalization.

16. The computer program product of claim 15 wherein adjusting the filter output value and the internal filter storage locations further comprises adjusting the filter output value and internal filter storage locations by plus or minus one circle.

* * * * *

UNITED STATES PATENT AND TRADEMARK OFFICE
CERTIFICATE OF CORRECTION

PATENT NO. : 7,152,081 B2  Page 1 of 1
APPLICATION NO. : 10/085254
DATED : December 19, 2001
INVENTOR(S) : Scott R. Gremmert It is certified that error appears in the above-identified patent and that said Letters Patent is hereby corrected as shown below:

On Title Page Item [73]
The assignee should be: Honeywell International Inc.

Signed and Sealed this

Seventeenth Day of April, 2007

JON W. DUDAS
*Director of the United States Patent and Trademark Office*

UNITED STATES PATENT AND TRADEMARK OFFICE
CERTIFICATE OF CORRECTION

PATENT NO. : 7,152,081 B2
APPLICATION NO. : 10/085254
DATED : December 19, 2006
INVENTOR(S) : Scott R. Gremmert It is certified that error appears in the above-identified patent and that said Letters Patent is hereby corrected as shown below:

On Title Page Item [73]
The assignee should be: Honeywell International Inc.

This certificate supersedes Certificate of Correction issued April 17, 2007.

Signed and Sealed this

Eighth Day of May, 2007

JON W. DUDAS
*Director of the United States Patent and Trademark Office*